United States Patent [19]
Hartmann

[11] 3,750,027

[45] July 31, 1973

[54] SURFACE WAVE FREQUENCY DISCRIMINATORS

[75] Inventor: Clinton S. Hartmann, Dallas, Tex.

[73] Assignee: Texas Instruments Incorporated, Dallas, Tex.

[22] Filed: Aug. 12, 1970

[21] Appl. No.: 63,190

[52] U.S. Cl. .................. 325/349, 325/487, 325/489, 329/118, 329/140, 333/72

[51] Int. Cl. .................. H03d 3/06

[58] Field of Search .................. 325/349, 387, 489; 329/116, 117, 118, 140; 333/30 R, 72; 310/8, 8.1, 8.2, 9.8

[56] References Cited

UNITED STATES PATENTS

| | | | |
|---|---|---|---|
| 3,461,408 | 8/1969 | Onoe et al. | 333/72 |
| 3,487,318 | 12/1969 | Herman | 333/72 X |
| 3,525,944 | 8/1970 | Smith | 329/140 |
| 2,312,079 | 2/1943 | Crosby | 329/117 X |
| 3,446,975 | 5/1969 | Adler et al. | 333/72 X |
| 3,571,713 | 3/1971 | Zachary | 325/349 |
| 3,568,082 | 3/1971 | Fjallbrant | 333/72 X |

*Primary Examiner*—Benedict V. Safourek
*Attorney*—Harold Levine, James O. Dixon, Andrew M. Hassell, Melvin Sharp, Gary C. Honeycutt, Michael A. Sileo, Jr., John E. Vandigriff, Henry T. Olsen and William E. Hiller

[57] ABSTRACT

Disclosed are apparatus for constructing a frequency discriminator utilizing surface wave devices. A plurality of interdigitated surface wave transducers are formed on a piezoelectric substrate along a common acoustic channel. The signal from the output transducers is rectified and then filtered to separate the r.f. component from the audio signal. A frequency discriminator having a preselected frequency response characteristic may be synthesized by constructing the individual interdigitated transducers to have the appropriate center frequency and number of pairs of electrodes.

18 Claims, 17 Drawing Figures

Inventor
Clinton S. Hartmann
BY Michael A. Sileo
ATTORNEY

WITNESS Richard L. Donaldson

SURFACE WAVE FREQUENCY DISCRIMINATORS

This invention relates to frequency discriminators and more specifically to frequency discriminators wherein a plurality of interdigitated surface wave transducers are used to synthesize a preselected frequency response characteristic.

Many applications require detecting a frequency modulated signal, and various methods have been utilized to accomplish this function. For example, in an F.M. receiver, a frequency discriminator circuit converts the frequency modulated signal from the I.F. stage into audio frequency signals. Conventional frequency discriminators utilize a resonant tuned transformer. Such discriminators, however, are not compatible with integrated circuit techniques. Further, the use of a transformer inherently limits the fractional bandwidth obtainable to about 20 percent or less. Another limitation associated with conventional type frequency discriminators is the fact that precise tuning is required to obtain an essentially linear response characteristic. Manifestly, such tuning is time consuming and expensive. Additionally, conventional discriminators exhibit undersirable phase shift characteristics as a function of the modulating frequency.

Accordingly, it is an object of the present invention to provide a frequency discriminator that is inexpensive and which is compatible with conventional applications such as in F.M. receivers and T.V. circuits.

Another object of the invention is to provide a frequency discriminator utilizing interdititated surface wave transducers in lieu of transformers.

Still another object of the present invention is to provide a frequency discriminator requiring no tuning.

A further object of the present invention is to provide a frequency discriminator having fractional bandwidths less than 1 percent up to about 40 percent, and having center frequencies from several megacycles up to about 1 GHz.

Another object of the invention is to provide apparatus suitable for synthesizing a frequency discriminator having a preselected response characteristic.

Another object of the invention is to produce a frequency discriminator having a negligible phase shift as a function of modulating frequency.

Briefly, and in accordance with the present invention, interdigitated surface wave transducers are utilized in lieu of conventional transformers in constructing a frequency discriminator. A bidirectional input transducer is formed upon the surface of a piezoelectric substrate to have a broadband frequency response having a center frequency corresponding to that desired in the frequency discriminator response characteristic. In the preferred embodiment, an output transducer is disposed on each side of the input transducer within the acoustic channel defined by the input transducer. One of the output transducers is fabricated to have a frequency response having a center frequency slightly below the center frequency of the input transducer and the other output transducer is fabricated to have a center frequency slightly above the input transducer center frequency. The output from each output transducer is rectified and filtered, producing a difference voltage between the filtered outputs that is substantially linear over a given frequency range. The shape, fractional bandwidth and center frequency of the response characteristic may be controlled by varying the spacing of electrodes of the individual transducers, the number of pairs of electrodes, and the weighting patterns utilized. This flexibility enables the design of essentially any desired response characteristic. Also, since the response characteristic is determined entirely by the physical configuration of the transducers on the substrate, no tuning is required subsequent to manufacture. If desired, however, external electrical tuning may be utilized to reduce insertion losses.

The novel featuresbelieved to be characteristic of this invention are set forth in the appended claims. The invention itself, however, as well as other objects and advantages thereof, may best be understood by reference to the following detailed description of illustrative embodiments when read in conjunction with the accompanying drawings, in which:

FIGS. *1a* and *1b* depict in graphical form respectively a typical frequency modulated signal and the response characteristic of a typical frequency discriminator;

FIG. 2 depicts a circuit of a prior art frequency discriminator utilizing a transformer;

FIGS. *3a*, *3b* and *3c* respectively depict, schematically and pictorally a frequency discriminator utilizing interdigitated surface wave transducers constructed in accordance with the present invention, the individual response characteristics of respective transducers, and the composite response characteristic thereof;

Figures 1A, 1B, 2:
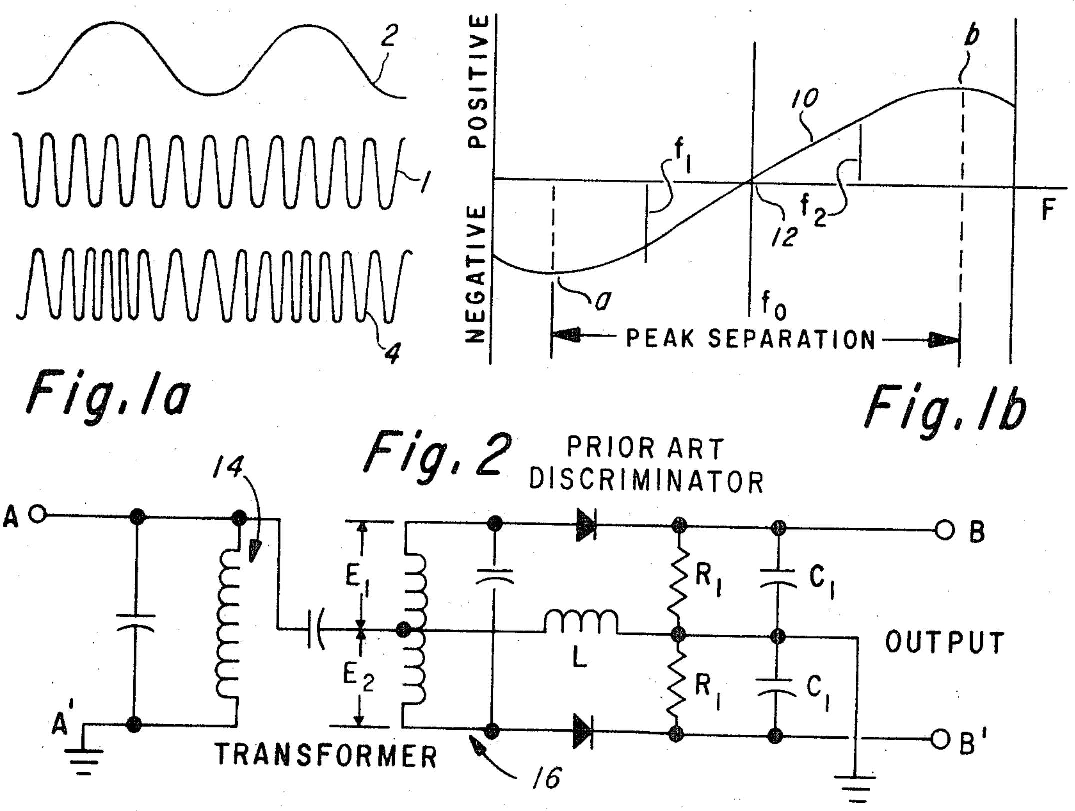

Referring now to the drawings, FIG. 1(a) depicts a typical frequency modulated signal. The unmodulated r.f. carrier wave is shown at 1, and the audio or modulating signal is shown as a sinusodal wave at 2. As the modulating signal 2 is impressed upon the carrier wave 1, the frequency of the carrier wave is modulated as shown at 4, increasing the frequency of the carrier wave where the modulating wave is a maximum, and decreasing the frequency of the carrier wave where the modulating wave is a minimum. The frequency modulated signal is detected by utilizing a frequency discriminator. FIG. 1(b) depicts the response characteristic of a typical frequency discriminator used in conventional F.M. receivers and T.V. circuits for detecting the frequency modulated signal of FIG. 1(a). As may be seen, the response curve 10 is substantially linear over a significant portion of the curve between peaks *a* and *b*. In demodulating a frequency modulated signal, it is necessary to operate within the linear portion of the response characteristic; that is, between $f_1$ and $f_2$, to eliminate distortion in the audio output signal. For example, in a typical F.M. receiver, the peak -to-peak frequency spread is approximately 600 KC while the linear portion of the curve is about 250 KC.

In FIG. 2, a frequency discriminator of the type conventionally used in the prior art is depicted. For example, see *Frederick Terman, Electronic and Radio Engineering*, McGraw-Hill Book Company, Inc., 1955, for a more complete description of this type of discriminator. Such a discriminator utilizes a conventional transformer 14 having a resonant tuned secondary circuit 16. When a frequency modulated signal having a frequency equal to the response frequency of the tuned circuit 16 is impressed across input A–A', voltages E1 and E2 generated across the secondary of the transformer are exactly equal but of opposite polarity. Therefore, the output across B–B' is zero. If the input signal across A–A' is lower than the resonance frequency of tuned circuit 16, voltage E2 will be larger than E1 and the output across B–B' will be negative. Such an output is shown generally in FIG. 1(b) between frequencies $f_1$ and $f_0$ along response curve 10. Similarly, if the frequency of the signal across A–A' is larger than the resonance frequency of tuned circuit 16, the voltage E1 will be larger and the output across B–B' would be positive. The output of such a signal is depicted in FIG. 1(b) by that portion of response curve 10 between frequencies $f_0$ and $f_2$. It may thus be seen that the circuit of FIG. 2 produces a d-c output the amplitude of which varies linearly as a function of frequency.

With reference to FIG. 3, a frequency discriminator comprised of apparatus in accordance with one embodiment of the present invention is depicted. Three interdigitated surface wave transducers 20, 22, and 24 are utilized. Transducer 20 is the input transducer while transducers 22 and 24 function as output transducers. The interdigitated surface wave transducers 20, 22, and 24 are deposited on a piezoelectric substrate 19; preferably a high efficiency coupling substrate such as lithium niobate, is used. The conductive electrodes, shown generally as 25, 27, 29, 31, 33, and 35, are formed upon the surface of the substrate in accordance with conventional photomask and metallization etching techniques. Adacent electrodes of a given transducer are spaced apart by one-half of a wave length of the center frequency desired for that transducer and are connected to separate conductive terminals, such as 80 and 81. While transducers 22 and 24 are shown to be formed on opposite sides of input transducer 20, it is to be appreciated that they may both be formed on the same side of input transducer 20. Such an arrangement, however, is not preferred since it introduces distortion and interference.

Specifically, interdigitated transducer 20 is a bidirectional broadband transducer. A signal impressed at input 17 generates a surface wave in the substrate 19 that propagates in opposite directions as indicated by arrows 21 and 23. The frequency of the surface wave is equal to the frequency of the input. The frequency response of the surface wave generated by interdigitated transducer 20 has a fractional bandwidth determined by the total number of pairs of electrodes 29–31. As used herein, the fractional bandwidth is understood to be that percentage of the center frequency that falls in the frequency response curve of transducer 20 within 3 db of its peak amplitude. As a rough approximation, the fractional bandwidth may be determined as 1/N where N equals the number of pairs of electrodes. For example, if input interdigitated transducer 20 has an electrode spacing such that a center frequency of 10.7 mhz is defined, and if 5 pairs of electrodes are used for transducer 20, then the resultant fractional bandwidth of the frequency response generated by a signal impressed across input 17 would be one fifth or 20 percent. Similarly, if 20 pairs of electrodes are used, the fractional bandwidth will be one twentieth or 5 percent. Thus, for the example where the center frequency was 10.7 mhz and the fractional bandwidth was 5 percent, the fractional bandwidth would equate to a frequency range of 535 KC.

A surface wave generated by input transducer 20 in response to a signal applied to input terminal 17 propagates in the directions indicated by arrows 21 and 23. Output surface wave transducer 22 detects the signal propagating in the direction indicated by arrow 21. Interdigitated surface wave transducer 22 is also a broadband transducer and has a center frequency defined by the spacing of adjacent electrodes that is slightly higher than the center frequency of input interdigitated transducer 20. Similarly, as the signal generated by input transducer 20 propagates in the direction indicated by arrow 23, this signal is detected by interdigitated transducer 24. This transducer has adjacent electrodes spaced apart to define a center frequency slightly lower than the center frequency of input transducer 20. Leads 26 and 28, attached respectively to output transducers 24 and 22, provide access to the output of the frequency discriminator. Output transducers may alternatively comprise unidirectional transducers as described hereafter.

Figure 3A:
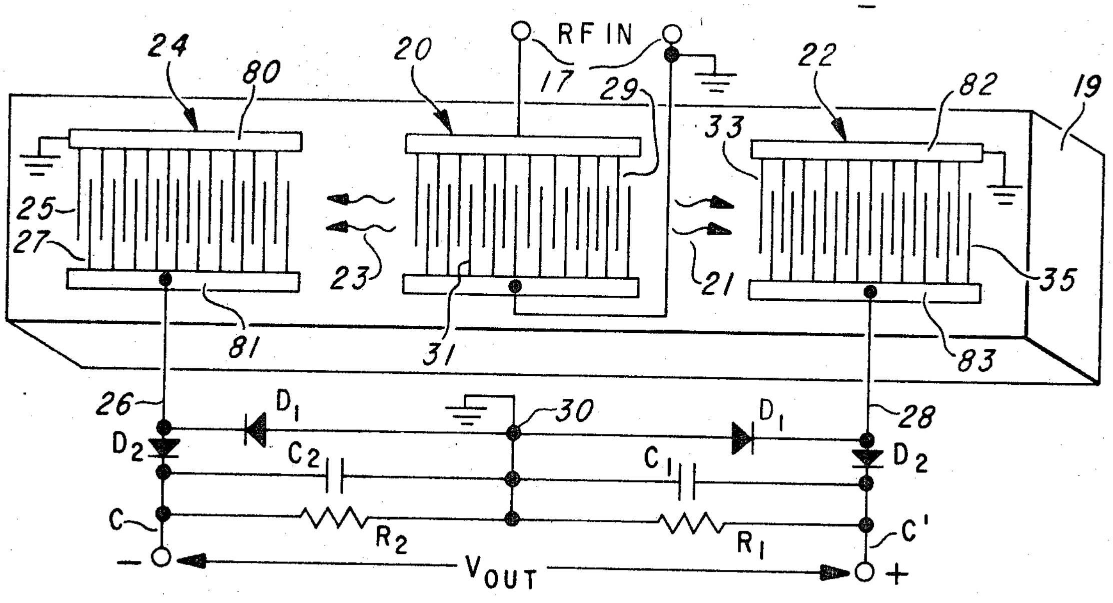

Diodes D2 are inserted in leads 26 and 28 respectively to provide rectifying means so that a d-c signal will be obtained across the output C–C'. In a preferred embodiment, a voltage doubler rectifying means is utilized. Diodes D1 are connected between the anode side of diodes D2 and ground, clamping the negative portions of the output signal from transducers 24 and 22 to ground, thus effectively doubling the positive portions of the output signal. At this juncture it should be pointed out that the output transducers 24 and 22 are d.c. isolated from ground which enables use of the voltage doubler circuit and thus enables increasing efficiency of operation. This is distinguished from the conventional type frequency discriminator circuit depicted in FIG. 2 wherein a d.c. path is provided through the secondary of the transformer, thus precluding a voltage doubler circuit as shown in FIG. 3*a*. As is understood by those skilled in the art, the polarity of diodes $D_1$ and $D_2$ could all be reversed and the circuit would still be operative to rectify the output of transducers 22 and 24, the only difference being a reversal of polarity. It should be noted that terminals 80 and 82 need not be grounded but may alternatively be electrically connected to node 30 in which case the ground shown at node 30 is not required.

Again with reference to FIG. 3a, on the cathode side of diodes $D_2$ a low-pass filter is provided between leads 26 and 28 respectively and ground. This filter comprises an R-C circuit operable to filter the r.f. carrier from the audio signal produced across the output C–C'. It is to be understood, of course, that many different rectifying and filter circuits known to those skilled in the art may be utilized.

Figure 3B:
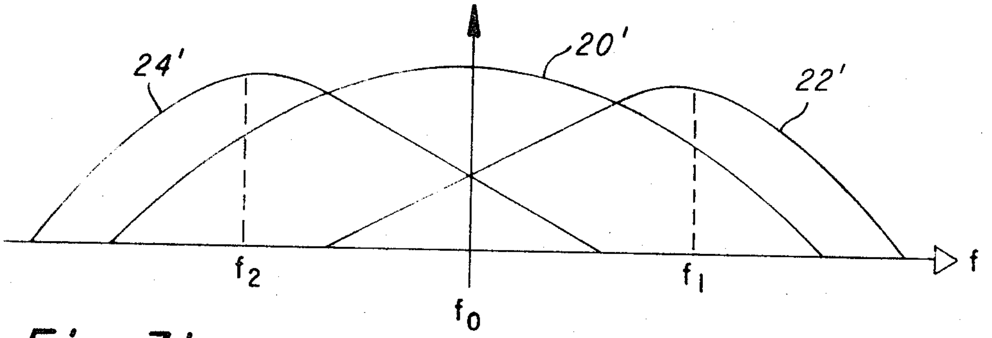
Figures 3C, 4, 5:
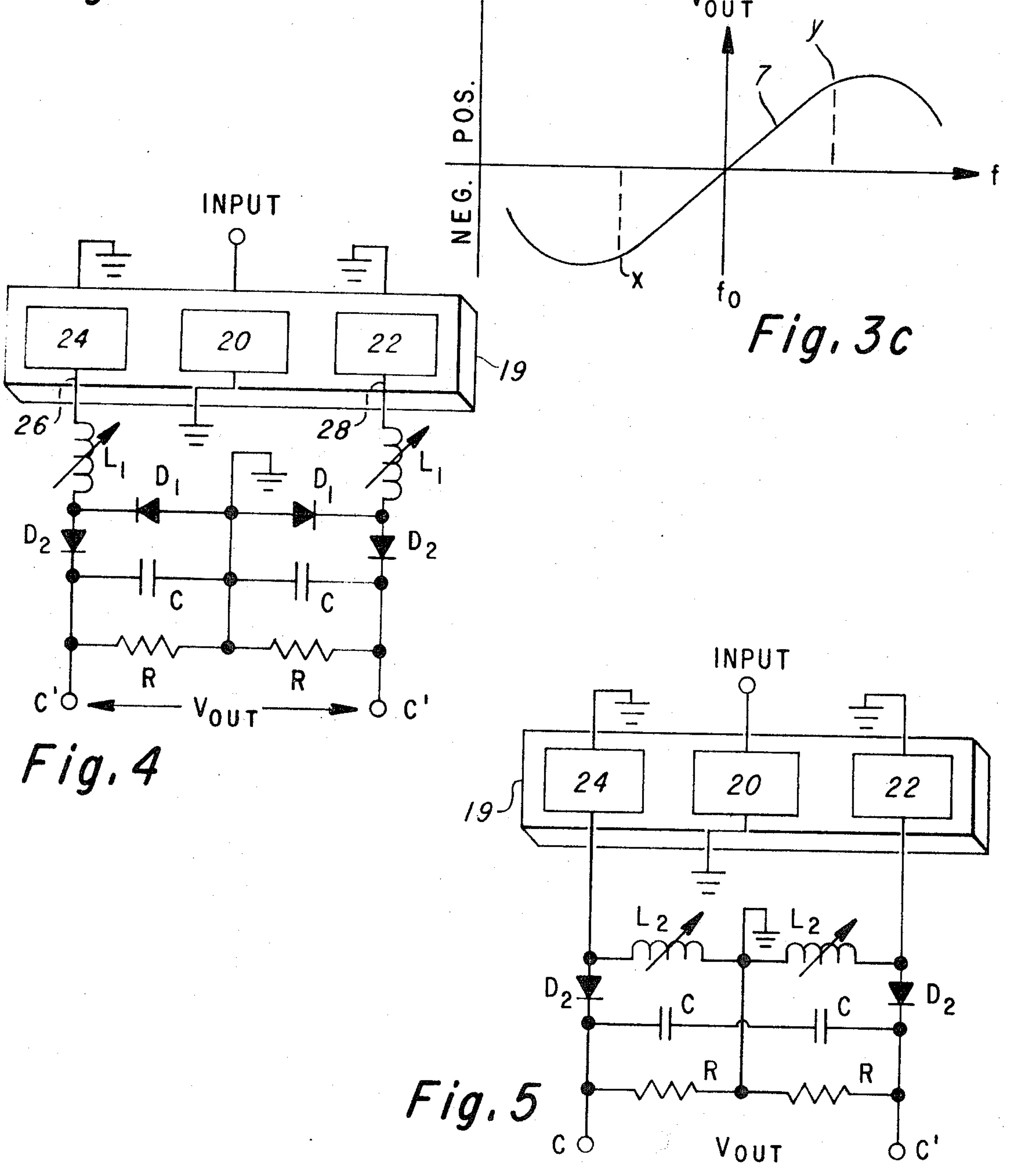
FIGS. 4–7 depict schematically and in block diagram modifications of the circuit shown in FIG. *3a;*

With reference to FIGS. 3*b* and 3*c*, it may more clearly be seen how a linear response characteristic is obtained across output C–C'. In FIG. 3*b* there is depicted a plot of the frequency response curves of transducers 20, 22, and 24. These response curves are indicated respectively as curves 20', 22', and 24'. As may be seen with reference to response curve 20', said response has a maximum amplitude at the center frequency $f_0$. With respect to response curve 22', it may be seen that this curve has a center frequency $f_1$ that is slightly higher than the center frequency $f_0$ and that the response curve 24' has a center frequency $f_2$ slightly lower than the center frequency $f_0$. With reference to FIG. 3*c*, there is depicted a plot 7 of the d.c. voltage response across the output transducers 22 and 24 as a function of frequency. As may be seen, the response characteristic 7 is obtained by subtracting response 24' from 22', producing a curve having a linear portion between points *x* and *y*. As may be seen, the response characteristic 7 of the frequency discriminator depicted in FIG. 3*a* is very similar to the frequency response curve 10 shown in FIG. 1(*b*).

In operation, a frequency modulated signal is applied to input transducer 20 at input 17. As understood by those skilled in the art, this signal induces an electric field between adjacent electrodes, such as 29–31, of input transducer 20, thereby generating a surface wave in the substrate 19. The surface wave thus generated propagates along the surface of substrate 19, subsequently being detected by output transducers 22 and 24 producing a d.c. signal having a level linearly responsive to the frequency of the modulating signal. These varying d.c. levels may then be applied to an audio amplifier and speaker to reproduce an audio output. A linear audio phase shift, and correspondingly, a low distortion audio output signal, is obtained since interdigitated surface wave transducers utilized to form the frequency discriminator typically exhibit linear phase characteristics.

In certain applications it is desired to vary the response characteristic shown in FIG. 3*c* to make the linear portion cover a broader frequency range, to make the response more linear, to change the slope of the response, etc. Such modifications may be accomplished by amplitude weighting of the interdigitated transducers 20, 22, and 24. By weighting is meant varying the interaction length of adjacent electrodes 29 and 31, 33 and 35, and 25 and 27, or the removal of selected electrodes, or varying the width of selected electrodes, or by varying the periodicity of the electrodes. To those skilled in the art, it is known that weighting an interdigitated transducer modifies its impulse response. By shaping the impulse response it is possible to obtain a desired frequency response from the transducer. It should be noted that non linear phase shift characteristics may be achieved, if desired, by properly weighting the transducers.

Again with reference to FIG. 3*a*, it may be seen that no tuning of the frequency discriminator is required. This is to be distinguished from the conventional frequency discriminator wherein the resonant circuitry connected to the secondary of the transformer requires precise tuning in order to produce the desired d.c. response characteristic shown in FIG. 1*b*. By using interdigitated surface wave transducers, the requirement for tuning is completely eliminated since the response is precisely deteremined by the physical design of the transducer itself. Metallization is effected to accurately define the desired pattern of electrodes on the surface of the piezoelectric substrate. The pattern, including spacing between electrodes, number of electrodes, and weighting, is selected to effect the desired center frequency, fractional bandwidth, and frequency response shape.

Additionally, in some situations it may be desired to externally electrically tune some or all of the interdigitated transducers to reduce insertion losses. If a high coupling efficiency substrate such as lithium niobate is used, electrical tuning is generally not required. When lower efficiency piezoelectric substrates are used, however, it may be desired to use inductors to tune the device to achieve greater impedance matching and thus increase efficiency. Many different arrangements of such electrical tuning are possible. One such arrangement is shown in FIG. 4, wherein transducers 20, 22, and 24 are shown for convenience sake in block diagram form. In FIG. 4, a series electrical tuning circuit is depicted. This circuit comprises inductors $L_1$ inserted respectively in lines 26 and 28 from output transducers 24 and 22. The value of the inductors is chosen to effect an impedance match between the load connected across the output and the transducers, thus reducing insertion losses. It should be appreciated, of course, that inductors $L_1$ may also be variable in order to facilitate achievement of optimum results. Series tuning as above described is most effective when matching to low impedance output loads.

With reference to FIG. 5, a parallel tuning circuit is depicted. In this type of tuning circuit an inductor $L_2$ is connected between the output of each of the output transducers 24 and 22 and ground, thus establishing a d.c. path to ground for the output transducers 22 and 24. With this arrangement, only one diode $D_2$ is required in each of the output transducer circuits. This facilitates interfacing the frequency discriminator with integrated circuitry because two diodes of opposite polarity are hard to fabricate in integrated circuit format. Parallel tuning as above described is most effective when matching to high impedance loads.

Figures 6, 7, 8, 9, 10:
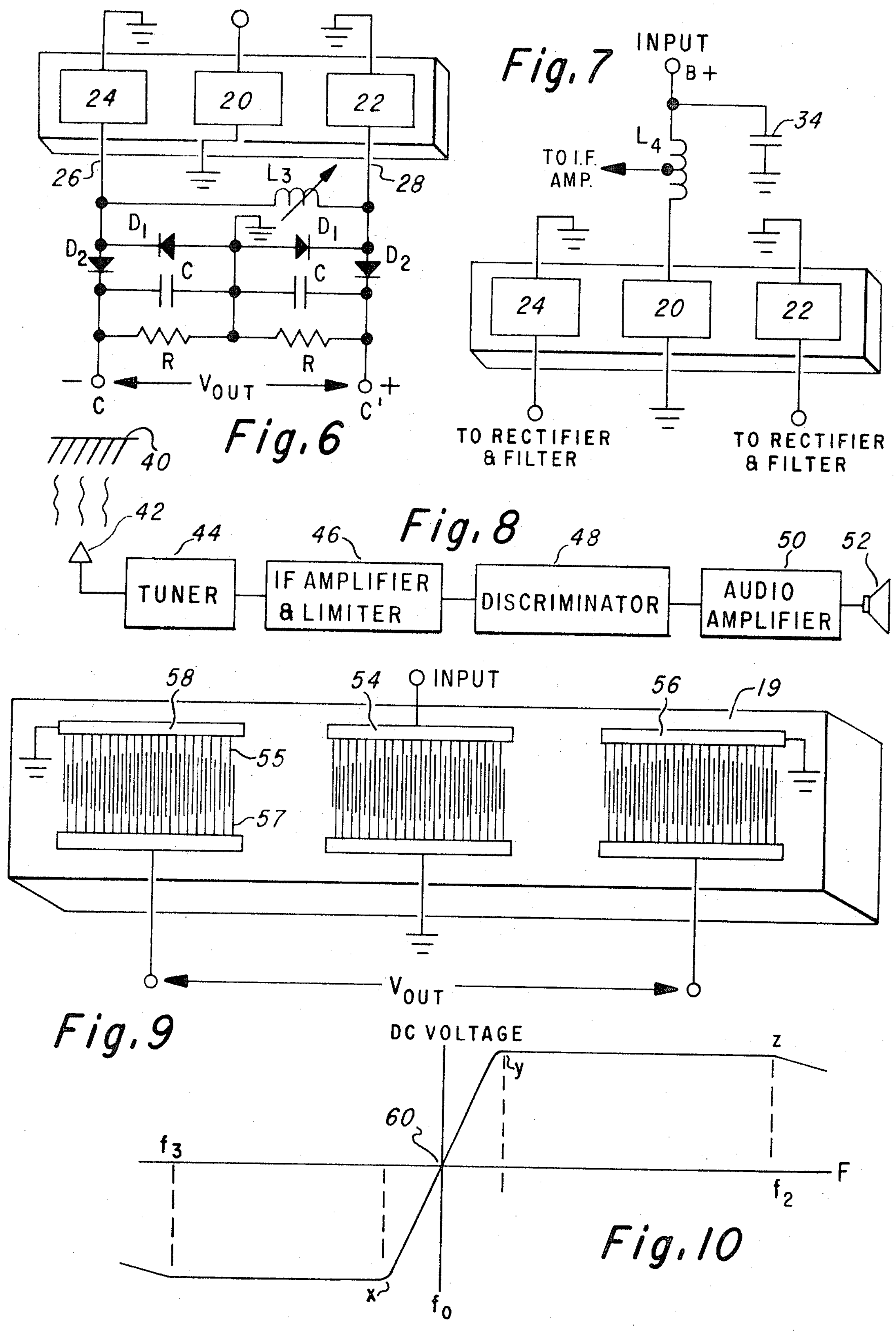
FIG. 8 depicts in block diagram a system for detecting an F.M. signal.
FIG. 9 depicts one type of weighted input and output transducers operable with the present invention.
FIG. 10 depicts in graphical form a response characteristic of a frequency discriminator having a wide pull-in range.

FIG. 6 depicts an embodiment for tuning output transducers 24 and 22 with a single inductor $L_3$. In this arrangement, the advantages of both parallel tuning, i.e., matching to a high impedance load, and voltage doubler action are realized. An inductor $L_3$ is connected across the output 26 and 28 of output transducers 24 and 22 respectively. Voltage doubler rectifying means $D_1$ and $D_2$ and an RC filter are connected to each output transducer at the junction of $L_3$ and the output lead from the respective transducers to produce an output across C–C' having a substantially linear portion over a predetermined frequency range.

FIG. 7 depicts still another method for electrically tuning the frequency discriminator to reduce insertion losses. In FIG. 7, an inductor $L_4$ is inserted in the input lead of input transducer 20. The other end of inductor $L_4$ is connected to a B+ source which also furnishes the power requirements for the preceding i.f. amplifier stage in an F.M. receiver circuit. Inductor $L_4$ is shunted to ground by capacitor 34 to provide an r.f. ground on the B+ side of the inductor.

It should be noted that inductor $L_4$ may be tapped at the appropriate point to provide an impedance match into the preceding i.f. amplifier stage.

As a specific example of one of the applications for a frequency discriminator in accordance with the present invention, FIG. 8 depicts in block diagram a system for detecting and demodulating a frequency modulated signal. A source 40 radiates the frequency modulated signal. This signal is intercepted by antenna 42. A tuner 44 selects the desired frequency modulated signal and i.f. amplifier and limiter 46 amplifies and processes the selected signal. The amplified signal forms the input for discriminator 48. The discriminator 48 comprises a plurality of interdigitated surface wave transducers in accordance with the present invention. The discriminator with its associated rectifying means and low pass filter converts the frequency modulated i.f. carrier into the corresponding audio frequency signal. This audio signal is applied to an audio amplifier 50 which amplifiers the signal for driving the speaker 52.

A surface wave frequency discriminator for use in the F.M. receiver depicted in FIG. 8 was constructed in accordance with the present invention. FIG. 9 depicts the surface wave transducers utilized in this frequency discriminator and represents the preferred embodiment of the transducers for use in an F.M. receiver circuit. Input transducer 54 and output transducers 56 and 58 were defined upon a piezoelectric substrate 19. The substrate measured approximately 0.1 × 0.25 × 1.0 inch and was comprised of Y cut lithium niobate. It should be appreciated, however, that other high efficiency coupling piezoelectric substrates could be utilized. The transducers were fabricated by depositing aluminum on the lithium niobate substrate by conventional metallization techniques using a photolithographic mask to expose an appropriate photoresist and then etching the substrate thus removing the undesired aluminum and leaving the metal electrodes and conductive terminals. Other metals, of course, could be used, such as, for example, gold. The metal electrodes of the interdigitated transducers were deposited to a thickness of between 1,000A and 3000A. Twenty pairs of electrodes, representative ones of which are designated generally at 55 and 57, were utilized for the respective transducers. Input transducer 54 was fabricated to have electrodes spaced apart by the appropriate distance to define a center frequency of 10.7 MHz having a fractional bandwidth of about 5 percent. Output transducer 56 was constructed to have a center frequency of about 11.00 MHz while output transducer 58 had a center frequency of about 10.40 MHz. Input transducer 54 was amplitude weighted to approximate an impulse response defined by a truncated (sin $x/x$ $x/x$) curve. Output transducers 56 and 59 were weighted to approximate an impulse response defined by a truncated ($\sin_2{}^2 x/x$) curve. Weighting the input according to a (sin $x/x$) function flattens out the frequency response curve while weighting the output transducer to approximate a function of ($\sin_2{}^2 x/x$) increases the linearity of the frequency response to these transducers. It should be appreciated that the extent of truncation is determined by the size of substrate that is available and the desired linearity of the frequency response. Also, it should be noted that for a given substrate size an optimum weighting function exists which produces maximum linearity. The output signal across output transducers 56 and 59 produced a d.c. signal as a function of frequency having a peak-to-peak bandwidth of about 400 KC.

To increase efficiency, it may be desirable to design output transducers 56 and 58 to have a fractional bandwidth that is slightly more narrow than input transducer 54. It should be appreciated, however, that the ratio of the fractional bandwidth of the output transducers with respect to the input transducers is not critical to operation of the present invention.

Certain applications of frequency discriminators require that the response characteristic have a relatively steep slope for the linear portion on either side of the center frequency and also exhibit a long pull-in range; that is, a long area of the response curve wherein it is relatively flat before the response tapers off. For example, a pull-in range of plus of minus 10 MHz is typical in satellite communications. Such a characteristic is shown in FIG. 10 wherein the pull-in range covers the frequency spread from $f_3$ to $f_2$. As may be seen, the linear portion of curve 60 between points x and y has a relatively steep slope. This linear portion may cover a frequency that is typically 10 percent or less off the pull-in range. Between points $y$ and $z$, the d.c. response characteristic tapers off and is relative flat up to frequency $f_2$. Heretofore, it has not been possible using conventional frequency discriminators to obtain a frequency response characteristic such as indicated in FIG. 10. In accordance with the present invention, however, such a response characteristic may be synthesized.

Figure 11:
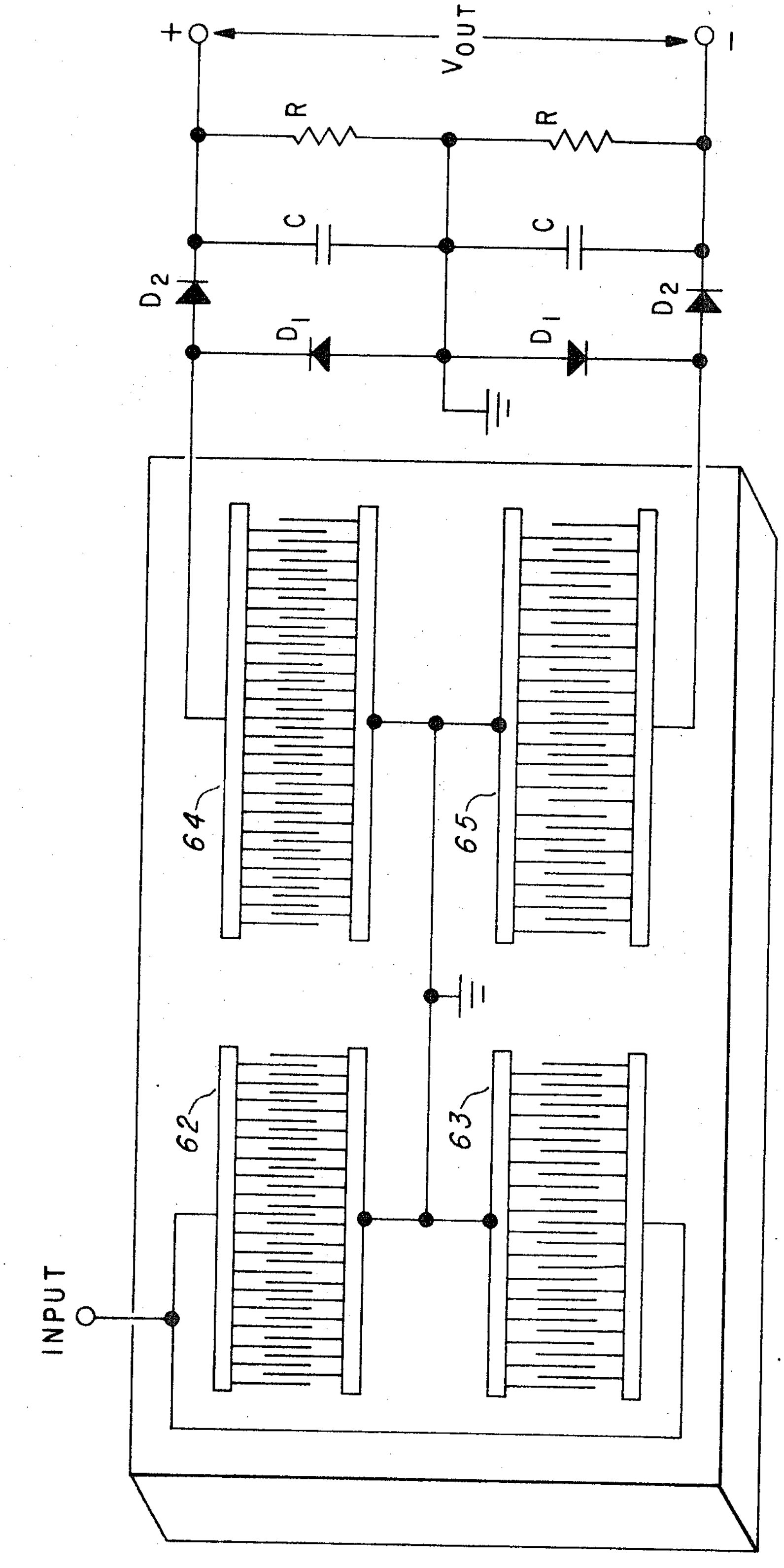
FIG. 11 depicts a circuit for a frequency discriminator in accordance with the present invention useful for obtaining fractional bandwidths up to 40 percent.

With reference to FIG. 11, apparatus suitable for synthesizing such a response characteristic is depicted. In FIG. 11, transducers 62 and 63 are input transducers and transducers 64 and 65 are output transducers. Transducers 62 and 64 synthesize the high frequency portions of the frequency response curve shown in FIG. 10 while transducers 63 and 65 synthesize the low frequency portion of said characteristic. Transducers 62 and 64 define one acoustical channel on the piezoelectric substrate 19 while transducers 63 and 65 define a second acoustical channel. Transducers 62–65 may be positioned on the same substrate as shown in FIG. 11 in a generally parallel configuration, or alternatively transducers 63 and 65 could be positioned on a second substrate or could even be positioned on the opposite side of the same substrate from transducers 62 and 64. This latter configuration would conserve space if size is critical.

Using the arrangement of surface wave transducers shown in FIG. 11, a frequency discriminator having a fractional bandwidth of up to 40 percent may be fabricated. Further, by appropriately weighting the various transducers, a frequency discriminator having any desired output characteristic, such as shown in FIG. 10, may be synthesized.

Figure 12:
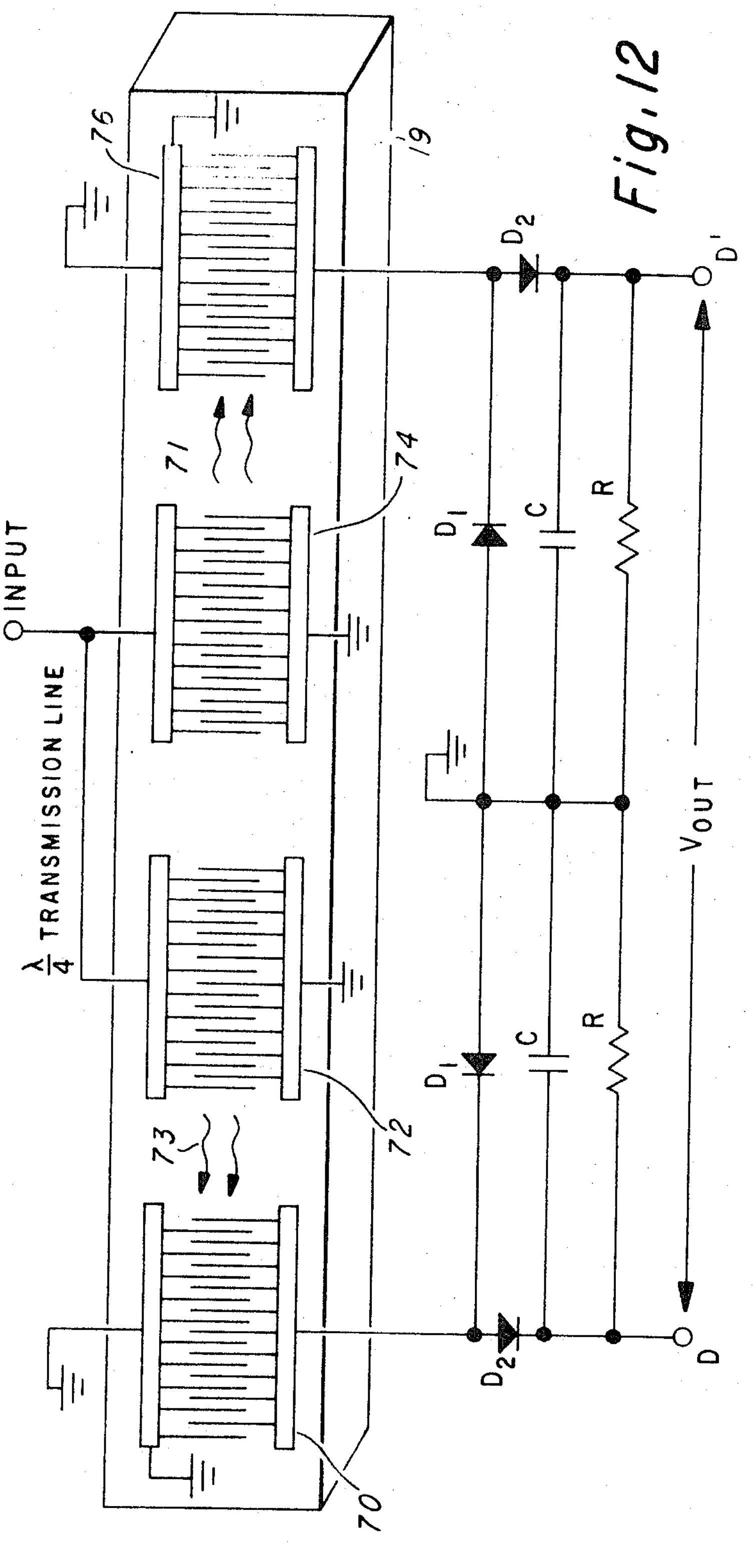
FIG. 12 depicts apparatus and circuitry in accordance with the present invention for constructing a frequency discriminator that utilizes a unidirectional input transducer.

With reference to FIG. 12, another embodiment of the present invention is depicted. In this embodiment four identical surface wave transducers shown at 70, 72, 74, and 76, may be utilized in order to provide a frequency discriminator. It should be appreciated that use of identical surface wave transducers simplifies fabrication techniques and lowers costs. In the configuration shown in FIG. 12, the input transducers 72 and 74 comprise a unidirectional transducer. As may be seen, input transducers 72 and 74 are connected by a quarter wave transmission line. The transducers 72 and 74 have directional properties which are a function of frequency. In other words, for higher frequencies the combination of transducers 72 and 74 preferentially radiates a surface wave in one direction only, such as, for example, the direction indicated by arrows 71. For lower frequencies, the combination of transducers 72 and 74 preferentially radiate energy in the opposite direction, such as shown by the arrows 73. Thus, the higher frequency components are detected by output transducer 76 and the lower components of the frequency are detected by output transducer 70. An output signal is produced across D–D' having the desired frequency response.

The directional transducer indicated at 72 and 74 may, for example, be similar to that described by W. Richard Smith et al, *Design of Surface Wave Lines with Interdigital Transducers*, IEEE Transactions on Microwave Theory and Techniques, Vol. MTT–17, No. 11, Nov., 1969.

Figure 13A:
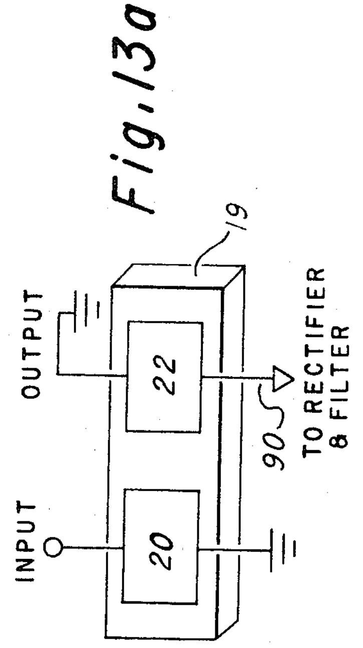
FIGS. 13*a* and 13*b* depict a circuit for a slope frequency discriminator and the response characteristics thereof.

In FIG. 13*a*, a slope frequency discriminator is depicted. This device is useful for applications wherein a zero d-c level is not required at the center frequency. This enables elimination of one of the transducers required in order to produce the desired response characteristic of the devices described previously herein, resulting in a device of significantly reduced size requirements.

Figure 13B:
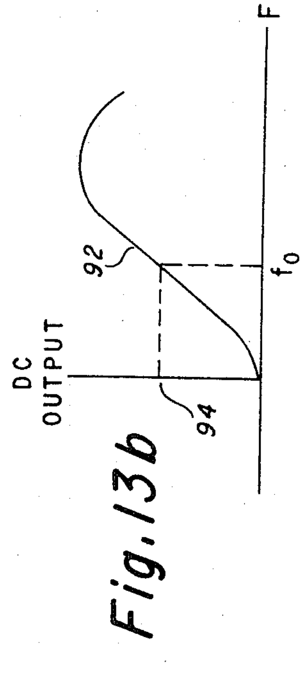

The slope frequency discriminator comprises an input transducer 20 having a frequency response similar to curve 20' shown in FIG. 3*c*, and an output transducer 22 having a frequency response characteristic similar to curve 22' of FIG. 3*c*. Rectifier and filter means are connected to output lead 90. The d-c voltage signal produced in response to an applied frequency modulated signal at the input is shown in FIG. 13*b*. As may be seen, the center frequency $f_o$ does not occur at the zero level of the output response 92, but rather is associated with some finite output voltage 94.

Additionally, it should be appreciated that any of the tuning circuits described in FIGS. 4–7 could be used in combination with the slope frequency discriminator shown in FIG. 13.

Although specific embodiments of this invention have been described herein, it will be apparent to a person skilled in the art that various modifications to the details of construction shown and described may be made without departing from the scope of this invention.

What is claimed is:

1. A surface wave frequency discriminator for an F.M. receiver comprising:

a. a piezoelectric substrate;

b. a broadband bidirectional interdigitated input transducer having a center frequency of 10.7 MHZ disposed on said substrate, said input transducer having first and second terminals for receiving an input signal, one of said terminals connected to circuit ground;

c. a first broadband interdigitated output transducer having a center frequency greater than 10.7 MHz disposed on said substrate adjacent one end of said input transducer, spaced apart from said input transducer along the path of propagation of the surface wave generated by said input transducer, said first output transducer having first and second terminals, one of which is connected to circuit ground, the other of which defines an output node;

d. a second broadband interdigitated output transducer having a center frequency less than 10.7 MHz disposed on said substrate at the opposite end of said input transducer spaced apart from said input transducer along the path of propagation of the surface wave of said input transducer, said second output transducer having first and second terminals one of which is connected to circuit ground, the other of which defines an output node;

e. rectifying means connected to said output nodes of said first and second transducers;

f. filter means connected between each of said output nodes and circuit ground whereby the output signal generated across said output transducers exhibits a frequency response having a portion thereof in the range of 10.7 MHz that is substantially linear and thus operable to detect F.M. signals.

2. A surface wave frequency discriminator as set forth in claim 1 wherein said substrate is lithium niobate.

3. A surface wave frequency discriminator as set forth in claim 1 wherein said first output transducer has a center frequency of about 11.0 MHz and said second output transducer has a center frequency of about 10.4 MHz.

4. A surface wave discriminator as set forth in claim 1, wherein the electrodes of said input transducer are defined in a preselected pattern to effect a weighting function substantially corresponding to a $(\sin x)/x$ function, and the electrodes of said output transducers are defined in a preselected pattern to effect a weighting function substantially corresponding to a $(\sin^2 x)x^2$ function.

5. A surface wave frequency discriminator having a fractional bandwidth of up to 40 percent comprising:

a. a piezoelectric substrate;

b. a first broadband interdigitated input transducer having a center frequency slightly higher than the desired center frequency disposed on said substrate to define a first acoustical channel;

c. a second broadband interdigitated input transducer having a center frequency slightly lower than the desired center frequency disposed on said substrate to define a second acoustical channel essentially parallel to said first acoustical channel;

d. a first output interdigitated transducer having a center frequency slightly higher than the desired center frequency, said first output transducer being disposed on said substrate within said first acoustical channel;

e. a second output interdigitated transducer having a center frequency slightly lower than the desired center frequency, said second output transducer being disposed on said substrate within said second acoustical channel;

f. rectifying means connected to each of said output transducers; and g. filter means operably connected to each of said output transducers whereby in response to an input signal an output signal is produced across said output transducers having a linear portion defining a fractional bandwidth of up to 40 percent.

6. A surface wave frequency discriminator as set forth in claim 5 wherein said first acoustical channel and said second acoustical channel are formed on opposite sides of the same substrate.

7. A frequency discriminator comprising in combination on a piezoelectric substrate;

a. an input interdigital acoustic surface wave transducer having a preselected center frequency and defining an acoustic channel in said substrate, said input transducer effective to generate an acoustic surface wave in said acoustic channel responsive to a frequency modulated input signal;

b. first and second output interdigital acoustic surface wave transducers disposed on said substrate within said acoustic channel, said output transducers respectively effective to produce output signals corresponding to said frequency modulated input signal, said first output transducer characterized by an electrode pattern which defines a center frequency that is higher than said preselected center frequency, said second output transducer characterized by an electrode pattern which defines a center frequency that is lower than said preselected center frequency; and c. rectifying and filtering means for receiving said output signals and providing a dc signal having an amplitude which varies substantially linearally as a function of frequency over a relatively broad frequency range and which has a zero dc amplitude level associated with said center frequency.

8. A surface wave frequency discriminator as set forth in claim 7 wherein electrical tuning means are provided for said input transducer, said tuning means comprising an inductor connected intermediate said input transducer and the input signal, said inductor being shunted to ground by a capacitor, said tuning means being operable to reduce insertion losses by matching the input impedance of said discriminator to the impedance of the input signal source.

9. A frequency discriminator as set forth in claim 8 wherein said rectifying means comprises a voltage doubler circuit.

10. A surface wave frequency discriminator comprising:

a. a piezoelectric substrate;

b. an input interdigital surface wave transducer disposed on said substrate and defining an acoustic channel along the surface thereof, said input transducer having an electrode pattern which defines a preselected center frequency, said input transducer effective to generate an acoustic surface wave responsive to a frequency modulated input signal applied to the electrodes thereof;

c. first and second output interdigitated surface wave transducers disposed on opposite sides of said input transducer within said acoustic channel and effective to generate electrical signals upon interaction with said acoustic surface wave, said first output transducer characterized by an electrode pattern which defines a center frequency that is higher than said preselected center frequency, said second output transducer characterized by an electrode pattern which defines a center frequency that is lower than said preselected center frequency; and d. coupling means connecting said pair of output transducers to a load, said coupling means effective to rectify the electrical signals generated by said output transducers to produce a dc signal having an amplitude which varies substantially linearly as a function of frequency over a predetermined frequency range.

11. A surface wave frequency discriminator as set forth in claim 10 wherein said input transducer is unidirectional, radiating relatively low frequencies in one direction and relatively high frequencies in the opposite direction.

12. A surface wave frequency discriminator as set forth in claim 11 wherein said output transducers are unidirectional.

13. A surface wave frequency discriminator as set forth in claim 10 wherein said coupling means further include filter means connected in series with the output of each of said output transducers, said filter means comprising an R-C circuit operably to filter the r.f. component from the output of said output transducers.

14. A surface wave frequency discriminator as set forth in claim 10 wherein said coupling means comprise an inductor.

15. In a system for detecting a frequency modulated signal which includes means for receiving and selecting a frequency modulated signal, means for amplifying and limiting the signal, a discriminator means for converting the frequency modulated signal into audio frequency variations of different amplitude, and audio amplifier and reproduction means for converting the electrical signal into audible sound, the improvement wherein said discriminator means comprises:

a. an input interdigital acoustic surface wave transducer defined on a piezoelectric substrate to define an acoustic channel, said input transducer characterized by a preselected center frequency;

b. first and second output interdigital acoustic surface wave transducers defined on said substrate within said acoustic channel, at opposite ends of said input transducer, said first output transducer characterized by a center frequency that is greater than said preselected center frequency, and said second output transducer characterized by a center frequency that is less than said preselected center frequency, said first and second output transducers effective to provide output signals corresponding to the frequency of a frequency modulated signal applied to said input transducer; and c. rectifying means for receiving said output signals and providing a dc signal for connection to said audio amplifier, said dc signal having an amplitude which varies substantially linearly as a function of frequency.

16. A system in accordance with claim 15 wherein said discriminator comprises an input transducer the electrodes of which are defined to effect amplitude weighting substantially corresponding to an impulse response defined by a truncated (sin x)/x curve, and a pair of output transducers, the electrodes of which are defined to effect amplitude weighting which substantially corresponds to an impulse response defined by a truncated $(\sin^2 x)/(x^2)$ curve.

17. A system for detecting a frequency modulated signal in accordance with claim 15 further including parallel tuning means operable to match the impedance of the output load and thereby reduce insertion losses.

18. A system for detecting a frequency modulated signal in accordance with claim 15 further including series tuning means operable to match the impedance of the output lead and thereby reduce insertion losses.

* * * * *